(12) United States Patent
Tanaka et al.

(10) Patent No.: US 10,390,469 B2
(45) Date of Patent: Aug. 20, 2019

(54) TAPE FEEDER

(71) Applicant: FUJI CORPORATION, Chiryu-shi (JP)

(72) Inventors: Keita Tanaka, Takahama (JP); Jun Iisaka, Nissin (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/756,658

(22) PCT Filed: Sep. 8, 2015

(86) PCT No.: PCT/JP2015/075522
§ 371 (c)(1),
(2) Date: Mar. 1, 2018

(87) PCT Pub. No.: WO2017/042898
PCT Pub. Date: Mar. 16, 2017

(65) Prior Publication Data
US 2018/0249605 A1 Aug. 30, 2018

(51) Int. Cl.
*H05K 13/02* (2006.01)
*H05K 13/04* (2006.01)

(52) U.S. Cl.
CPC ........... *H05K 13/02* (2013.01); *H05K 13/021* (2013.01); *H05K 13/0417* (2013.01); *H05K 13/0419* (2018.08)

(58) Field of Classification Search
CPC ............ H05K 13/021; H05K 13/0408; H05K 13/0417
See application file for complete search history.

(56) References Cited

U.S. PATENT DOCUMENTS 4,820,369 A  4/1989  Kubo
6,082,954 A * 7/2000 Foster .................... B65H 20/22
                                                    156/759

(Continued)

FOREIGN PATENT DOCUMENTS

EP    1 530 414 A1    5/2005
JP    63-112366 A     5/1988

(Continued)

OTHER PUBLICATIONS

Extended European Search Report dated May 28, 2018 in Patent Application No. 15903563.3.

(Continued)

*Primary Examiner* — Mark A Osele
(74) *Attorney, Agent, or Firm* — Oblon, McClelland, Maier & Neustadt, L.L.P.

(57) ABSTRACT

A tape feeder is provided with a cover tape peeling member that peels a portion of cover tape from an upper surface of component supply tape at a position forward of a component pickup position in accordance with feeding operation of the component supply tape such that a component inside the component supply tape is exposed. The cover tape peeling members are exchangeably attached to the tape feeder, and include a half peeling cover tape peeling member for peeling only one side of a joining section and folding the cover tape from one side such that the component inside the component supply tape is exposed, and a full peeling cover tape peeling member for peeling both sides of the joining section of the cover tape and folding the cover tape over from a front end of the cover tape such that the component inside the component supply tape is exposed.

4 Claims, 7 Drawing Sheets

(56) References Cited

U.S. PATENT DOCUMENTS

| | | | | |
|---|---|---|---|---|
| 6,402,452 | B1 * | 6/2002 | Miller | H05K 13/0417 |
| | | | | 156/751 |
| 6,594,887 | B1 * | 7/2003 | Okuda | H05K 13/0452 |
| | | | | 29/739 |
| 6,631,870 | B2 * | 10/2003 | Bergstrom | H05K 13/0419 |
| | | | | 242/615 |
| 9,642,294 | B2 * | 5/2017 | Karlsson | H05K 13/02 |
| 9,802,399 | B2 * | 10/2017 | Ohashi | H05K 13/0417 |
| 2007/0241028 | A1 | 10/2007 | Larsson et al. | |
| 2010/0239401 | A1 * | 9/2010 | Kim | B65H 37/002 |
| | | | | 414/412 |

FOREIGN PATENT DOCUMENTS

| | | |
|---|---|---|
| JP | 6-190646 A | 7/1994 |
| JP | 8-23190 A | 1/1996 |
| JP | 2005-236184 A | 9/2005 |
| JP | 2007-67156 A | 3/2007 |
| JP | 2013-225716 A | 10/2013 |
| WO | 2014/118994 A1 | 8/2014 |
| WO | WO-2015029124 A1 *  3/2015  ......... H05K 13/0417 |  |

OTHER PUBLICATIONS

International Search Report dated Dec. 15, 2015 in PCT/JP2015/075522 filed Sep. 8, 2015.

* cited by examiner (a) Half peeling is possible (b) Half peeling is not possible
(only full peeling is possible)

TAPE FEEDER

TECHNICAL FIELD

The present disclosure relates to a tape feeder configured to peel cover tape (also known as top tape or top film) from an upper surface of component supply tape at a position forward of a component pickup position in accordance with operation of feeding the component supply tape, such that a component inside the component supply tape is exposed.

BACKGROUND ART

Because component supply tape is configured from cover tape joined to an upper surface of carrier tape in which components are stored in a single line at even intervals, as disclosed in patent literature 1 (JP-A-H8-23190), with a tape feeder, cover tape is peeled from an upper surface of the component supply tape at a position forward of a component pickup position in coordination with the feeding of the component supply tape to a component pickup position so as to expose a component housed in the component supply tape, and then the component housed in the component supply tape is picked up via suction at the component pickup position using a suction nozzle of a component mounter.

CITATION LIST

Patent Literature

Patent literature 1: JP-A-H8-23190

SUMMARY

However, among methods for peeling cover tape in a tape feeder, there is a "full peeling" method in which the joining portions at both sides of the cover tape are peeled such that the leading end of the cover tape is pulled back on itself, and there is a "half peeling" method in which only the joining portion at one side of the cover tape is peeled such that the cover tape is folded over from one side. Generally, full peeling method tape feeders are provided with a cover tape collection device (a device for taking in cover tape into a cover tape collection case, a cover tape take-up device, or the like), but half peeling method tape feeders discard cover tape from the feeder in a state with one side still joined to the component supply tape (carrier tape), thus with half peeling method tape feeders a cover tape collecting device is unnecessary, which has the advantages of making the configuration simple and enables the device to be thin. Also, there is an advantage in that there is no need to set the cover tape such that it can be collected by a collection device when setting component supply tape on the tape feeder.

However, depending on the type of component supply tape, with the half peeling method, the component in the component supply tape is not fully exposed, meaning that it is not possible to pick up the component in the component supply tape using a suction nozzle of the component mounter. For such component supply tape for which half peeling is not possible, it is necessary to fully peel the cover tape using a full peeling method tape feeder. Accordingly, to support various types of commercially available component supply tapes, it is necessary to prepare both full peeling method tape feeders and half peeling method tape feeders, which increases the quantity of tape feeders that need to be prepared, thus raising production costs and requiring a large amount of storage space for tape feeders.

With the above patent literature 1, a full peeling method tape feeder equipped with a cover tape take-up device is disclosed, and this full peeling method tape feeder is configured with a removable tape width changing member for changing the width of tape on a tape path on an upper surface section of the tape feeder such that component supply tapes of different widths can be set; by removing this tape width changing member and exchanging it for a tape width changing member of a different tape width, it is possible to set component supply tape with a different tape width. As described above, with the half peeling method, one side of the cover tape remains joined to the carrier tape and the carrier tape and the cover tape are ejected from the feeder and discarded together, therefore for component tape for which half peeling is possible, it is desirable to use the half peeling method, but with the configuration of patent literature 1 above, the half peeling method cannot be used even for component supply tape for which half peeling is possible, and it is necessary to always use the full peeling method.

Thus, an object of the present disclosure is to provide a single tape feeder that can easily support both half peeling and full peeling at a low cost.

To solve the above problem, the present disclosure is a tape feeder including: a tape feeding device configured to feed component supply tape to a component pickup position, the component supply tape having cover tape joined to a top surface thereof; and a cover tape peeling member configured to peel at least a portion of the cover tape from the upper surface of the component supply tape at a position forward of the component pickup position in accordance with feeding operation of the component supply tape, such that a component inside the component supply tape is exposed, wherein the cover tape peeling member is exchangeably attached to the tape feeder, and is configured from a half peeling cover tape peeling member for peeling only one side of a joining section out of both sides of the joining section of the cover tape and folding the cover tape from one side such that the component inside the component supply tape is exposed, and a full peeling cover tape peeling member for peeling both sides of the joining section of the cover tape and folding the cover tape over from a front end of the cover tape such that the component inside the component supply tape is exposed.

With the present disclosure, if the component supply tape to be used is component supply tape for which half peeling is possible, the half peeling method can be used by attaching the half peeling cover tape peeling member to the tape feeder. On the other hand, if the component supply tape to be used is component supply tape for which half peeling is not possible, the full peeling method can be used by attaching the full peeling cover tape peeling member to the tape feeder. In this manner, by simply exchanging the cover tape peeling member attached to the tape feeder to and from a half peeling member to a full peeling member, it is possible to easily support both half peeling and full peeling with a single feeder and at a low cost.

Here, the half peeling cover tape peeling member and the full peeling cover tape peeling member may have a settable tape width that is the same or that is different. For example, when it is possible to use both a dedicated half peeling tape feeder (for which full peeling is not possible) and a tape feeder of the present disclosure, because component supply tape for which half peeling is not possible cannot be used at the dedicated half peeling tape feeder even if the tape width matches the dedicated half peeling tape feeder, by attaching a full peeling cover tape peeling member of a tape width that is the same as the dedicated half peeling tape feeder to the tape feeder of the present disclosure, it is possible to use component supply tape for which half peeling is not possible.

Further, a tape feeder of the present disclosure may include a cover tape collection device configured to collect cover tape peeled by the full peeling cover tape peeling member. Here, the cover tape collection device may be a device that collects cover tape inside a cover tape collection case, or a device that takes up cover tape onto a winding reel. Alternatively, the cover tape collection device may be a device that hangs downwards from the tape feeder and applies tension to the cover tape while separating it from the upper surface of the component supply tape in accordance with feeding operation of the component supply tape. For example, if a smallest width tape feeder on which is set component supply tape with the smallest tape width is taken to be a dedicated half peeling tape feeder, because the cover tape collection device can be omitted, the smallest width tape feeder can be made even thinner; but even in this case, by attaching a full peeling cover tape peeling member of the same tape width as the smallest width dedicated half peeling tape feeder to a tape feeder with a width wider than the smallest width, it is possible to use component supply tape of the smallest width for which half peeling is not possible.

The present disclosure can be applied to various configurations of tape feeders, and may be configured as a cassette type feeder in which a reel, on which component supply tape is wound, is exchangeably loaded in a cassette case. The cassette type tape feeder is made to be thin on the assumption that it will be automatically exchanged by a robot, and with a smallest width cassette type tape feeder for component supply tape for which half peeling is possible, there are cases in which the feeder is not provided with a cover tape collection device inside the cassette case and the feeder functions as a dedicated half peeling tape feeder. In such a case too, by attaching a full peeling cover tape peeling member of the same tape width as the smallest width dedicated half peeling tape feeder to a cassette type tape feeder with a wide tape width, it is possible to use component supply tape of the smallest width for which half peeling is not possible.

DESCRIPTION OF EMBODIMENTS

Figure 1:
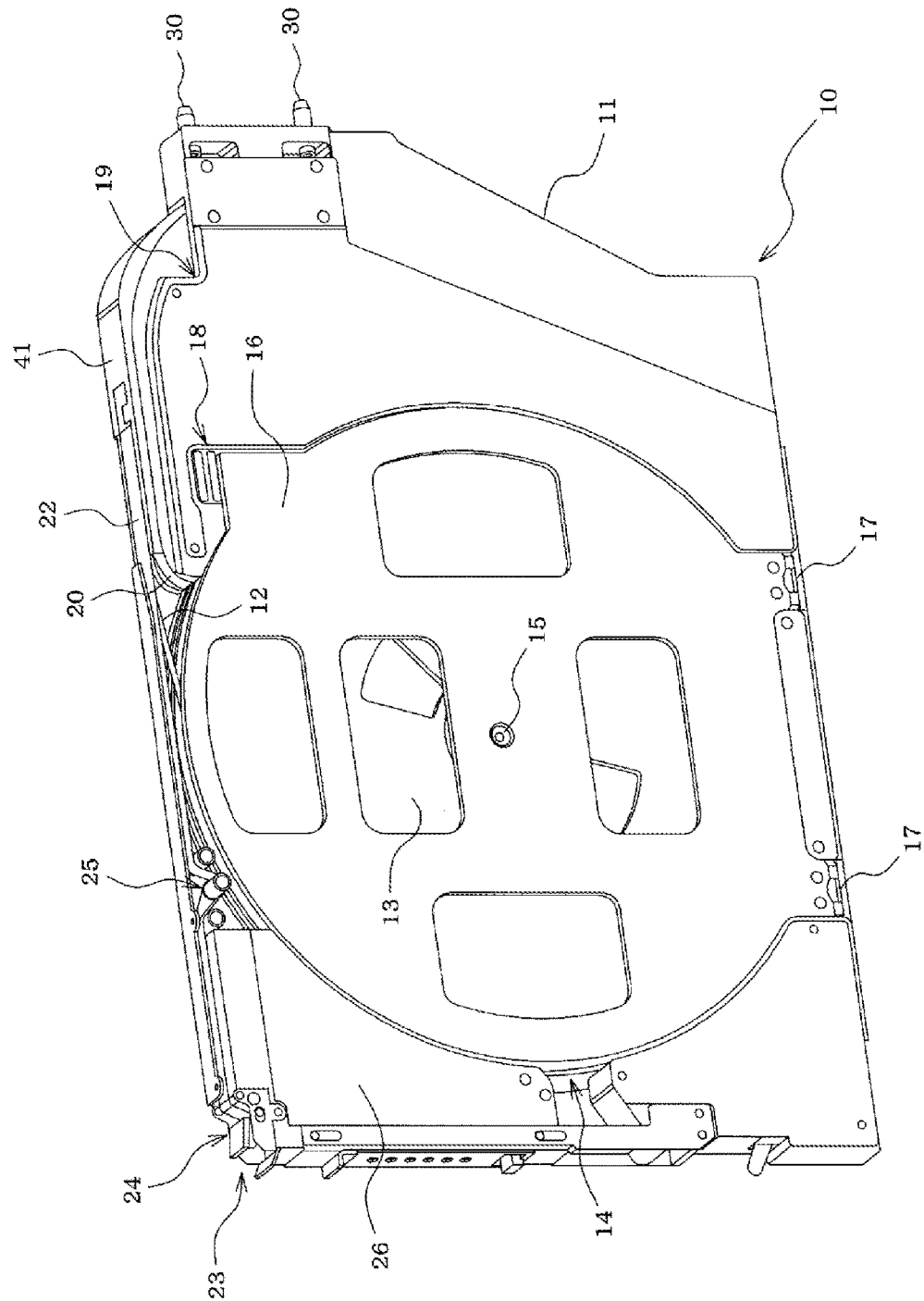
FIG. 1 is a perspective view showing a cassette type tape feeder of a first embodiment of the present disclosure.

The following describes a specific embodiment for carrying out the present disclosure when applied to cassette type tape feeder 10.

Cassette case 11 of cassette type tape feeder 10 is small and thin and formed from metal or plastic plates or the like. Tape loading section 14, in which reel 13 around which component supply tape 12 is wound is loaded in an exchangeable (removable) manner, is provided inside cassette case 11. Reel holding shaft 15 that holds reel 14 in a rotatable manner is provided in the center of tape loading section 14. Reel retaining cover 16 used to open and close reel loading section 14 is attached to cassette case 11 via hinge 17, and also provided is lock mechanism 18 that locks and unlocks reel retaining cover 16 in the closed position. When reel 13 is exchanged, an operator releases the lock of lock mechanism 18, opens reel retaining cover 16, and exchanges reel 13, then, when reel retaining cover 16 is closed, reel retaining cover 16 is automatically locked in the closed position by lock mechanism 18. Note that, lock operation of lock mechanism 18 may be performed manually by an operator, similar to operation for releasing the lock.

Figure 5:
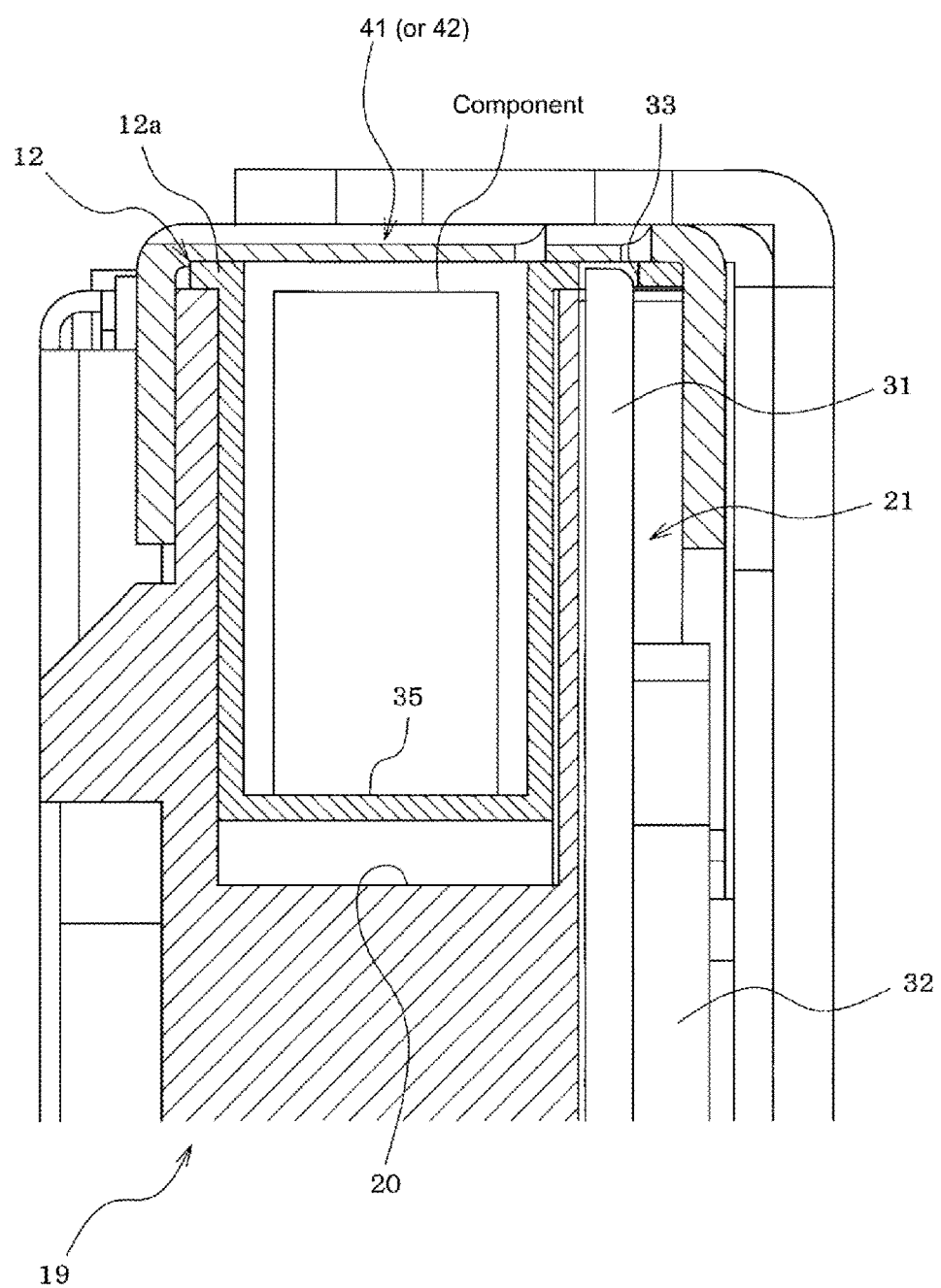
FIG. 5 is a vertical cross section showing a 12 mm wide full peeling (or half peeling) cover tape peeling member attached to an upper surface section of a 12 mm wide feeder main body.

Provided on feeder main body 19 housed inside cassette case 11 are items such as tape feeding device 21 (refer to FIGS. 5 and 6) that feeds component supply tape 12 pulled from reel 13 along tape path 20 (refer to FIGS. 5 and 7) to the component pickup position, and cover tape collection device 23 that collects cover tape 22 peeled from the upper surface of component supply tape 12 at a position forward of the component pickup position in accordance with feeding operation of component supply tape 12.

As shown in FIG. 1, cover tape collection device 23 is configured from cover tape take-up device 24 that pulls cover tape 22 separated from the upper surface of component supply tape 12 in a direction opposite to the tape feeding direction, tension roller mechanism 25 that applies tension to the cover tape 22 taken up by cover tape take-up device 24, and cover tape collection case 26 in which cover tape 22 fed from cover tape take-up device 24 is collected. Note that, component supply tape 12 from which cover tape 22 has been peeled (carrier tape 12a) is guided to a lower section of tape feeder 10 to be discarded, and is collected inside a waste tape collection box (not shown) provided in a lower section of a component mounter.

The component pickup position is in the vicinity of the end portion of the tape feeding direction side of the top surface of cassette case 11 (feeder main body 19). Two positioning pins 30 and a connector (no shown) for communication and power are provided on an end surface of cassette case 11 (feeder main body 19) towards the tape feeding direction, and when tape feeder 10 is set on a feeder setting section (not shown) of the component mounter, by inserting the two positioning pins into positioning holes on the feeder setting section, tape feeder 10 is positioned with respect to the feeder setting section, the connector for communication and power of tape feeder 10 is inserted into the connector for feeder and power of the feeder setting stand such that communication is possible between tape feeder 10 and the component mounter, and such that operation power is supplied to tape feeder 10 from the component mounter.

Figure 2:
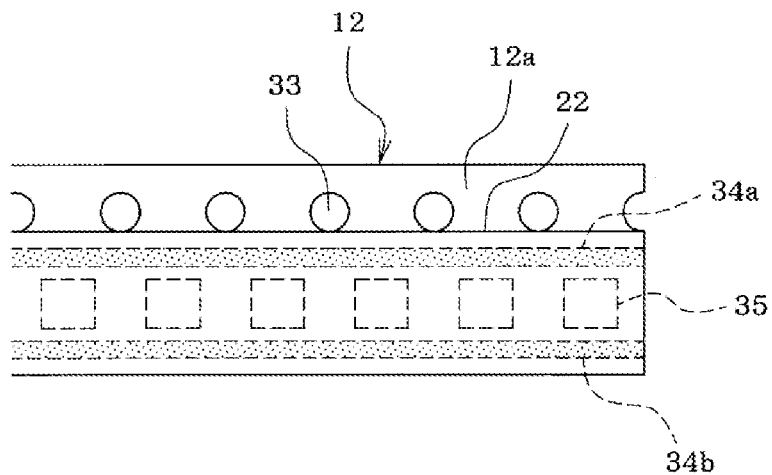
FIG. 2(a) is a plan view of component supply tape for which half peeling is possible.
FIG. 2(b) is a plan view of component supply tape for which half peeling is not possible.
Figure 2:
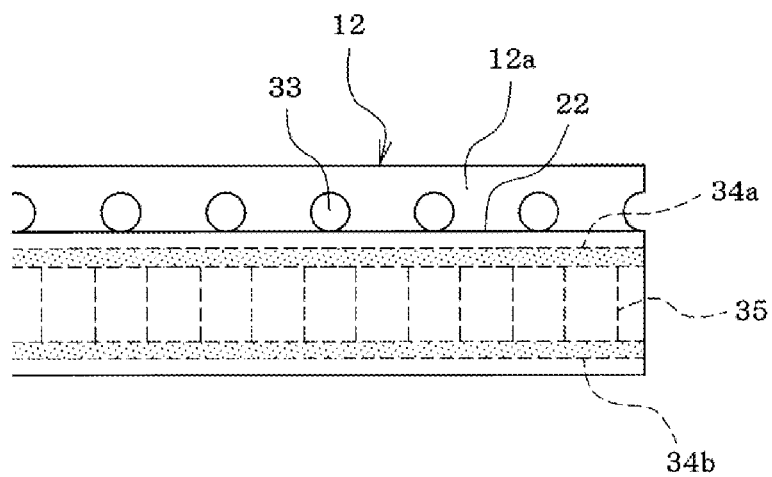

Tape feeding device 21 is formed from sprocket 31 (refer to FIGS. 5 and 6) which is provided in the vicinity of and below the component pickup position, and motor 32 that drives sprocket 31 to rotate, and tape feeding device 21 pitch feeds component supply tape 12 to the component pickup position by engaging the teeth of sprocket 31 with tape feeding holes 33 (refer to FIG. 2) which are formed in the edge of one side of component supply tape 12 at a predetermined pitch and rotating sprocket 31.

However, as shown in FIGS. 2(a) and 2(b), component supply tape 12 is formed with both side sections of cover tape 22 joined (for example, bonded or glued) to an upper surface of carrier tape 12a, thus, as shown in FIG. 2(a), so long as the positions of joining sections 34a and 34b on both sides of cover tape 22 do not coincide with component storage cavities 35 of carrier tape 12a, "half peeling" can be performed in which only joining section 34b of cover tape 22 is peeled and folded over to one side of cover tape 22, such that, similar to "full peeling" described later, the component inside component storage cavity 35 can be completely exposed and therefore be picked up by a suction nozzle (not shown) of the component mounter. However, as shown in FIG. 2(b), if the positions of joining sections 34a and 34b on both sides of cover tape 22 coincide with component storage cavities 35 of carrier tape 12a, if cover tape 22 is half peeled, the component inside component storage cavity 35 is not completely exposed, meaning that it is not possible to pick up the component inside component storage cavity with a suction nozzle of the component mounter; therefore, "full peeling" of peeling both joining sections 34a and 36b from both sides of cover tape 22 and folding cover tape 22 backwards from its front edge must be performed, such that the component inside component storage cavity 35 can be completely exposed to be picked up by a suction nozzle of the component mounter.

Here, in the present embodiment, to enable peeling of cover tape 22 using either of the full peeling method or the half peeling method in accordance with the type of component supply tape 12 being used, full peeling cover tape peeling member 41 and half peeling cover tape peeling member 42 are attached to an upper section of feeder main body 19 in an exchangeable manner by way of screws, an engaging means, or the like, so as to cover above tape path 20 in the vicinity of the component pickup position.

Figure 3:
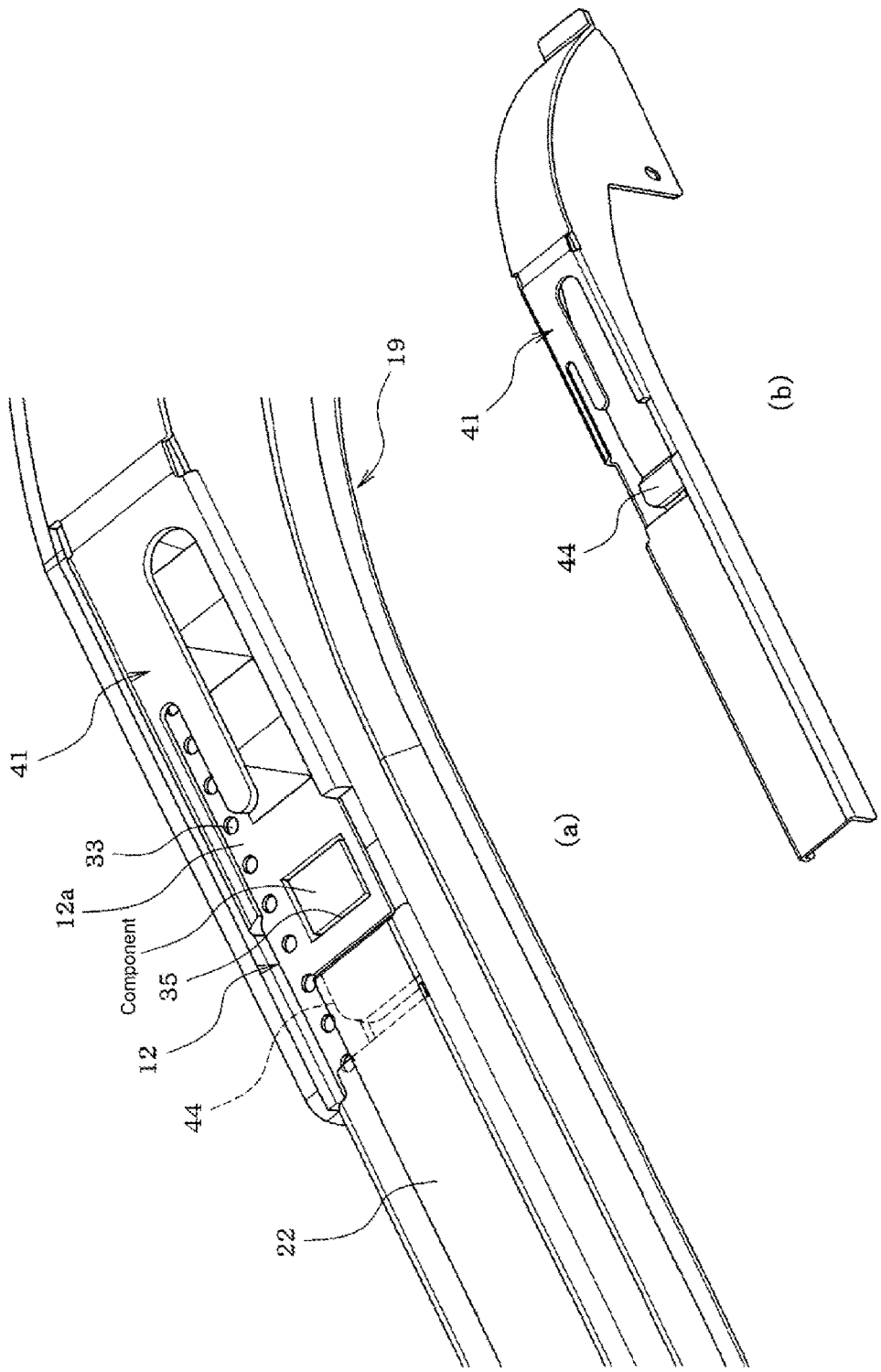
FIG. 3(a) is a perspective view of a full peeling cover tape peeling member attached to an upper surface section of a feeder main body.
FIG. 3(b) is a perspective view of a full peeling cover tape peeling member.

As shown in FIG. 3, full peeling end section 44 for fully peeling cover tape 22 from component supply tape 12 at a position forward of the component pickup position is provided on full peeling cover tape peeling member 41, and the configuration is such that cover tape 22 is fully peeled from the upper surface of component supply tape 12 at full peeling end section 44 in accordance with feeding operation of component supply tape 12 and is collected by cover tape collection device 23.

Figure 4:
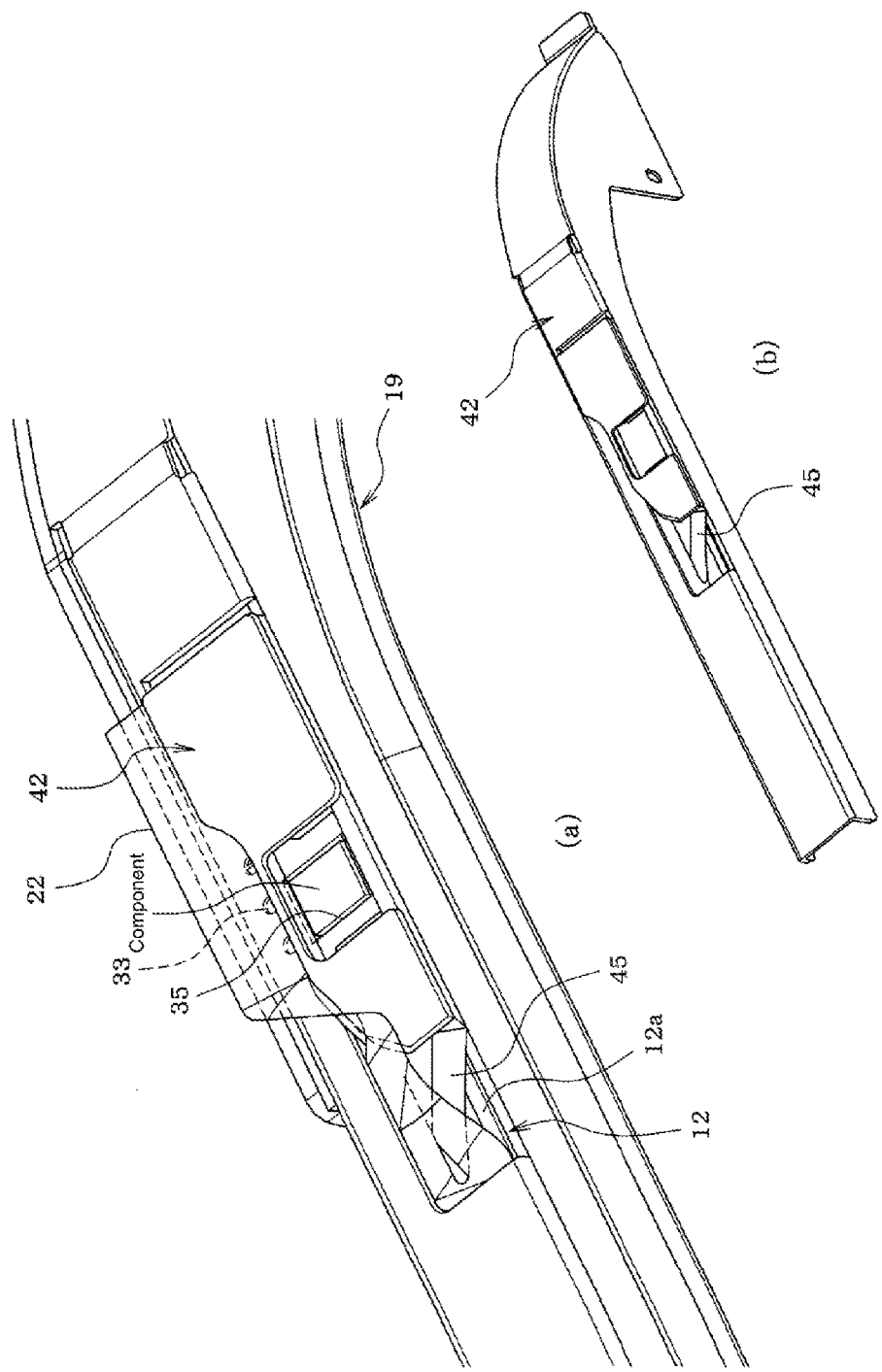
FIG. 4(a) is a perspective view of a half peeling cover tape peeling member attached to an upper surface section of a feeder main body.
FIG. 4(b) is a perspective view of a half peeling cover tape peeling member.

On the other hand, as shown in FIG. 4, half peeling end section 45 for half peeling cover tape 22 from component supply tape 12 at a position forward of the component pickup position is provided on half peeling cover tape peeling member 42, and the configuration is such that cover tape 22 is half peeled from the upper surface of component supply tape 12 at half peeling end section 45 in accordance with feeding operation of component supply tape 12. Half peeled cover tape 22 is discarded from tape feeder 10 in a state with one side (the tape feeding hole 33 side) of cover tape 22 still joined to carrier tape 12a, and is collected inside a waste tape collection box (not shown) arranged in a lower section of the component mounter.

Here, full peeling cover tape peeling member 41 and the half peeling cover tape peeling member 42 may have a settable tape width that is the same or that is different. For example, when it is possible to use both a dedicated half peeling tape feeder (for which full peeling is not possible) and tape feeder 10 of the present embodiment, because component supply tape 12 for which half peeling is not possible cannot be used at the dedicated half peeling tape feeder even if the tape width matches the dedicated half peeling tape feeder, by attaching a full peeling cover tape peeling member 41 of a tape width that is the same as the dedicated half peeling tape feeder to tape feeder 10 of the present embodiment, it is possible to use component supply tape 12 for which half peeling is not possible.

With tape feeder 10 of the present embodiment, for example, 12 mm wide component supply tape 12, or 8 mm wide component supply tape 12 can be set, and two types each of full peeling cover tape peeling member 41 and half peeling cover tape peeling member 42 are prepared with widths of 12 mm and 8 mm. Thus, for 12 mm wide and 8 mm wide component supply tape 12, peeling of cover tape 22 is possible by both the full peeling method and the half peeling method by appropriately exchanging cover tape peeling members 41 and 42.

Figure 6:
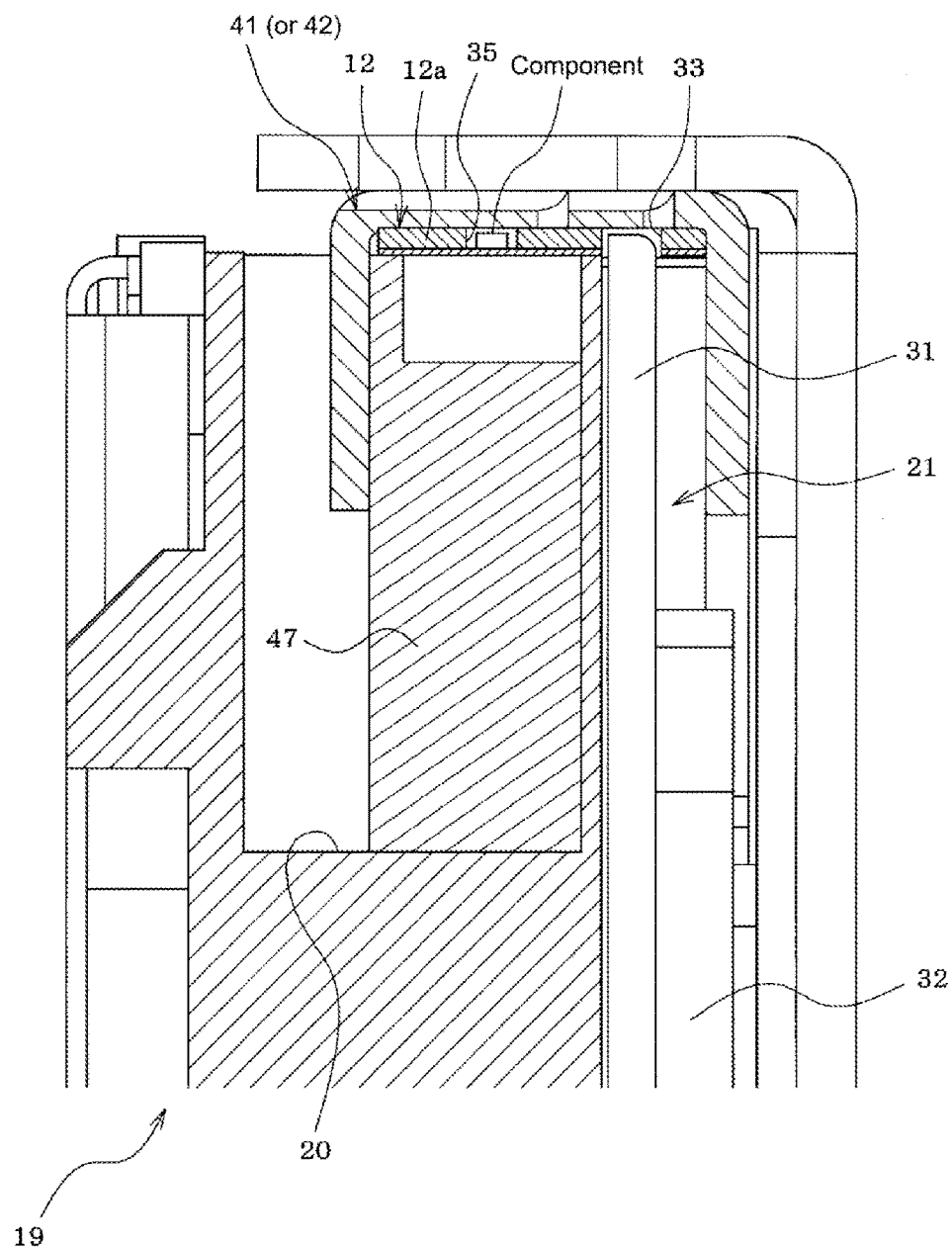
FIG. 6 is a vertical cross section showing an 8 mm wide half peeling (or full peeling) cover tape peeling member attached to an upper surface section of a 12 mm wide feeder main body.
Figure 7:
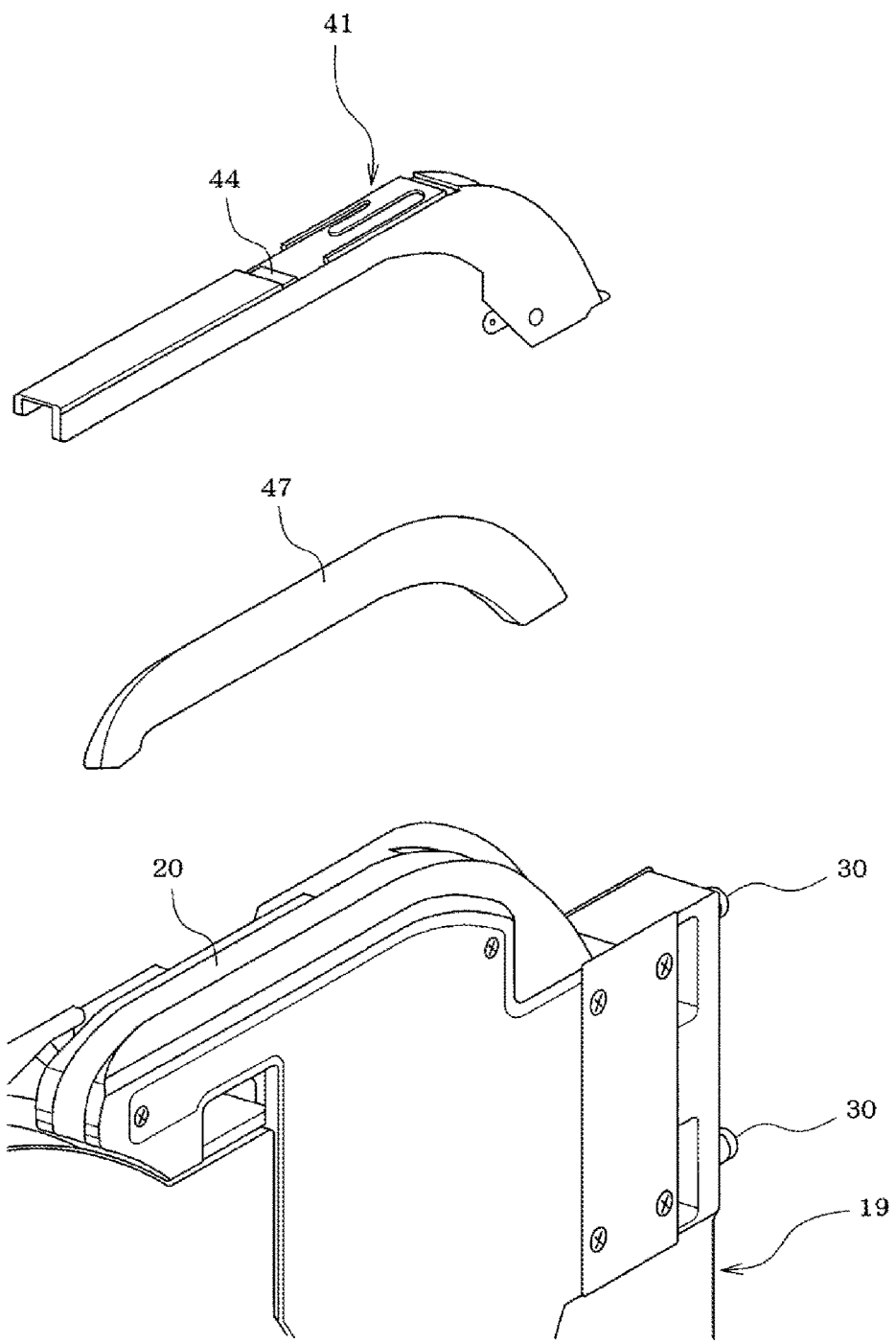
FIG. 7 is a perspective view showing an 8 mm wide full peeling cover tape peeling member and an 8 mm wide tape passage forming member removed from the 12 mm wide feeder main body.

When 8 mm component supply tape 12 is set on tape feeder 10 of the present embodiment, as shown in FIG. 6, by removably inserting 8 mm wide tape path forming member 47 inside 12 mm wide tape path 20 of tape feeder 10, the 12 mm wide tape path 20 is converted to an 8 mm wide tape path. Thus, 8 mm wide component supply tape 12 is guided to the component pickup position while being supported at both edges by 8 mm tape path forming member 47.

With an embodiment above, if the component supply tape 12 to be used is component supply tape for which half peeling is possible, the half peeling method can be used by attaching half peeling cover tape peeling member 42 to tape feeder 10. On the other hand, if the component supply tape 12 to be used is component supply tape for which half peeling is not possible, the full peeling method can be used by attaching full peeling cover tape peeling member 41 to tape feeder 10. In this manner, by simply exchanging the cover tape peeling member attached to tape feeder 10 to and from half peeling cover tape peeling member 42 and full peeling cover tape peeling member 41, it is possible to easily support both half peeling and full peeling with a single tape feeder 10 and at a low cost.

Also, with the embodiment, because the cassette type tape feeder 10 is made to be thin on the assumption that it will be automatically exchanged by a robot, with a smallest width (8 mm wide) cassette type tape feeder, there are cases in which there is no space to provide a cover tape collect device inside the cassette case such that the feeder must function as a dedicated half peeling tape feeder. In such a case too, by attaching full peeling cover tape peeling member 41 of the same tape width as the smallest width (8 mm wide) dedicated half peeling tape feeder to a cassette type tape feeder 10 with a wide tape width, it is possible to use component supply tape 12 of the smallest width (8 mm wide) for which half peeling is not possible.

Note that, with tape feeder 10 of the present embodiment, 12 mm wide component supply tape 12, or 8 mm wide component supply tape 12 can be set, but three or more types of tape width may be settable, or only one type of tape width may be settable, that is, the configuration may be such that full peeling cover tape peeling member 41 and half peeling cover tape peeling member 42 may be exchangeably attached to an upper surface section of feeder main body 19.

Also, cover tape collection device 23 is not limited to a configuration in which cover tape 22 fully peeled from an upper surface of component supply tape 12 is collected inside cover tape collection case 26, the configuration may be such that cover tape 22 is taken up on a take-up reel, or cover tape collection device 23 may be a device that hangs downwards from tape feeder 10 and applies tension to cover tape 22 while separating it from the upper surface of component supply tape 12 in accordance with feeding operation of component supply tape 12.

It goes without saying that the present disclosure is not limited to a cassette type tape feeder, and may be applied, for example, to tape feeders of various configurations, without departing from the scope of the disclosure.

REFERENCE SIGNS LIST

10: tape feeder; 11: cassette case; 12: component supply tape; 12a: carrier tape; 13: reel; 14: reel loading section; 15: reel holding shaft; 19: feeder main body; 20: tape path; 21: tape feeding device; 22: cover tape; 23: cover tape collection device; 24: cover tape take-up device; 25: tension roller mechanism; 26: cover tape collection case; 31: sprocket; 33: tape feeding hole; 34a, 34b: joining portion; 35: component storage cavity; 41: full peeling cover tape peeling member; 42: half peeling cover tape peeling member; 44: full peeling end section; 45: half peeling end section; 47: tape path forming member

The invention claimed is:

1. A tape feeder comprising:

a feeder main body with a tape path provided therein, the tape path having a first width;

a tape feeding device configured to feed component supply tape to a component pickup position, the component supply tape having cover tape joined to a top surface thereof; and a cover tape peeling member configured to peel at least a portion of the cover tape from the upper surface of the component supply tape at a position forward of the component pickup position in accordance with feeding operation of the component supply tape, such that a component inside the component supply tape is exposed, wherein the cover tape peeling member is exchangeably attached to the tape feeder, and is configured from a half peeling cover tape peeling member for peeling only one side of a joining section out of both sides of the joining section of the cover tape and folding the cover tape from one side such that the component inside the component supply tape is exposed, and a full peeling cover tape peeling member for peeling both sides of the joining section of the cover tape and folding the cover tape over from a front end of the cover tape such that the component inside the component supply tape is exposed, the tape feed further comprises a cover tape collection device provided at one end of the tape feeder and configured to collect cover tape peeled by the full peeling cover tape peeling member, the cover tape collection device being configured from a cover tape take-up device that pulls the cover tape from the top surface of the component supply tape in a direction opposite to a tape feeding direction, the half peeling cover tape peeling member has a settable tape width different to that of the full peeling cover tape peeling member, and the tape feeder further comprises a narrow tape path forming member which is inserted into the tape path when width of the tape is less than the first width, such that a narrower of the half peeling cover tape peeling member and the full peeling cover tape peeling member includes a side wall which abuts a side wall of the narrow tape path forming member so as to provide a gap between the side wall of the narrow tape path forming member and an inner side wall of the feeder main body defining the tape path.

2. The tape feeder according to claim 1, wherein the tape feeder is configured as a cassette type feeder, and a reel on which the component supply tape is wound is exchangeably loaded in a cassette case that forms an external case for the reel.

3. The tape feeder according to claim 1, further comprising:

a tension roller mechanism that applies a tension to the cover tape taken up by the cover tape take-up device; and a cover tape collection case in which cover tape fed from the cover tape take-up device is collected.

4. The tape feeder according to claim 1, wherein the first width is 12 mm and the narrow tape path forming member forms a tape path with a width of 8 mm.

* * * * *